(12) United States Patent
Wilhite

(10) Patent No.: US 9,048,940 B2
(45) Date of Patent: Jun. 2, 2015

(54) PASSIVE BYPASS FOR NETWORK EXTENDING

(71) Applicant: Clear RF LLC, Spokane, WA (US)

(72) Inventor: Peter E. Wilhite, Medical Lake, WA (US)

(73) Assignee: CLEAR RF, LLC, Spokane, WA (US)

( * ) Notice: Subject to any disclaimer, the term of this patent is extended or adjusted under 35 U.S.C. 154(b) by 20 days.

(21) Appl. No.: 14/012,898

(22) Filed: Aug. 28, 2013

(65) Prior Publication Data

US 2014/0065949 A1  Mar. 6, 2014

Related U.S. Application Data

(60) Provisional application No. 61/695,967, filed on Aug. 31, 2012.

(51) Int. Cl.
| | | |
|---|---|---|
| *H04B 7/14* | (2006.01) | |
| *H04B 1/06* | (2006.01) | |
| *H04B 1/74* | (2006.01) | |
| H04B 7/155 | (2006.01) | |
| H04B 10/038 | (2013.01) | |
| H04B 10/079 | (2013.01) | |

(52) U.S. Cl.
CPC ............ *H04B 1/745* (2013.01); *H04B 7/15507* (2013.01); *H04B 10/038* (2013.01); *H04B 10/0791* (2013.01); *H03F 2203/7239* (2013.01); *H04B 7/155* (2013.01)

(58) Field of Classification Search
CPC .......... H04B 1/046; H04B 7/14; H04B 7/145; H04B 7/15507; H04B 7/15557; H04B 10/038; H04B 10/0791; H04B 10/0797; H03F 2203/7239
USPC .......................... 455/7, 8, 9, 15, 245.1, 250.1
See application file for complete search history.

(56) References Cited

U.S. PATENT DOCUMENTS

| | | | | | |
|---|---|---|---|---|---|
| 4,264,894 | A | * | 4/1981 | Ellington ...................... 714/4.4 |
| 4,412,245 | A | * | 10/1983 | Kwok ............................ 725/149 |
| 5,229,875 | A | * | 7/1993 | Glista ............................... 398/4 |
| 5,230,096 | A | * | 7/1993 | Davies et al. ................. 455/217 |
| 5,896,183 | A | * | 4/1999 | Terk et al. ..................... 348/706 |
| 6,060,949 | A | * | 5/2000 | Kaufman et al. ............... 330/51 |
| 2003/0157885 | A1 | * | 8/2003 | Lukkarila et al. ............ 455/11.1 |
| 2003/0193368 | A1 | * | 10/2003 | Jackson ............................ 330/51 |
| 2003/0193369 | A1 | * | 10/2003 | Jackson et al. .................. 330/51 |
| 2006/0115268 | A1 | * | 6/2006 | Zirnheld et al. ................. 398/59 |
| 2011/0140784 | A1 | * | 6/2011 | Tajima et al. .................. 330/277 |

FOREIGN PATENT DOCUMENTS

JP            405259771    * 10/1993    ............... H03G 3/20

* cited by examiner

*Primary Examiner* — Duc M Nguyen
(74) *Attorney, Agent, or Firm* — Wolfe-SBMC

(57) ABSTRACT

In one or more embodiments, a cellular signal is received and directed to a path bypassing active amplifier circuitry. This may be in response to the active amplifier circuitry being non-operational (e.g., in a fault state) or detecting that an RF environment does not necessitate amplification. Bypassing the active amplifier circuitry may enable transmission of a non-amplified cellular signal when active circuitry is in a fault state or while traveling through areas of strong cellular service (e.g., proximate a cell tower).

20 Claims, 7 Drawing Sheets

US 9,048,940 B2

PASSIVE BYPASS FOR NETWORK EXTENDING

RELATED APPLICATION

This present disclosure claims priority to U.S. Provisional Patent Application Ser. No. 61/695,967 filed Aug. 31, 2012, the disclosure of which is incorporated by reference herein in its entirety.

BACKGROUND

The description within this background is provided for the purpose of generally presenting the context of the present disclosure. Unless otherwise indicated herein, material described in this section is neither expressly nor impliedly admitted to be prior art to the present disclosure or the appended claims.

Booster amplifiers are commonly used to extend the range of a cellular network. By amplifying uplink and/or downlink cellular signals between a mobile station and base station, a booster amplifier can extend the range of a wireless network. There may be times, however, when active circuitry of a booster amplifier may fail. When the active circuitry of the boost amplifier fails, the booster amplifier may not be able to transmit or receive cellular signals which can result in a loss of communication with the cellular network. In particular, booster amplifiers directly connected with a mobile station or modem device can be susceptible to this loss of communication when the active circuitry of the booster amplifier fails.

SUMMARY

This summary is provided to introduce a selection of concepts in a simplified form that are further described below in Detailed Description. This summary is not intended to identify key features or essential features of the claimed subject matter, nor is it intended to be used to limit the scope of the claimed subject matter.

In one or more embodiments, a cellular signal is received and directed to a path bypassing active amplifier circuitry. This may be in response to the active amplifier circuitry being non-operational (e.g., in a fault state). Bypassing the active amplifier circuitry may enable transmission of the cellular signal.

In other embodiments, it is determined whether RF amplification circuitry is operational and RF signals are directed based on the determination. The RF signals are directed to an input port of the RF amplification circuitry if the RF amplification circuitry is operational or directed to other circuitry to bypass the RF amplification circuitry if the RF amplification circuitry is not operational.

BRIEF DESCRIPTION OF THE DRAWINGS

The same numbers are used throughout the drawings to reference like features.

DETAILED DESCRIPTION

Overview

In one or more embodiments, a cellular signal is received and directed to a path bypassing active amplifier circuitry. This may be in response to the active amplifier circuitry being non-operational (e.g., in a fault state). Bypassing the active amplifier circuitry may enable transmission of the RF signal. Alternately or additionally, the cellular signal may be directed to a path bypassing active amplifier circuitry in response to determining that network conditions do not necessitate amplification of the cellular signal (e.g., proximate a cell tower) Bypassing the active circuitry can reduce a noise factor applied to an RF environment of the network. By so doing, effects of the booster amplifier on the network may be minimized when non-amplified signal strength is sufficient for communication.

In other embodiments, it is determined whether RF amplification circuitry is operational and RF signals are directed based on the determination. The RF signals are directed to an input port of the RF amplification circuitry if the RF amplification circuitry is operational or directed to other circuitry to bypass the RF amplification circuitry if the RF amplification circuitry is not operational.

In the discussion that follows, a section entitled "Operating Environment" is provided and describes one example operating environment in which one or more embodiments can be deployed. Following this, a section entitled "Example Device" is provided and gives an example of an adaptive network extender in accordance with one or more embodiments. Last, a section entitled "Example Methods" describes example methods in accordance with one or more embodiments.

Operating Environment

Figure 1:
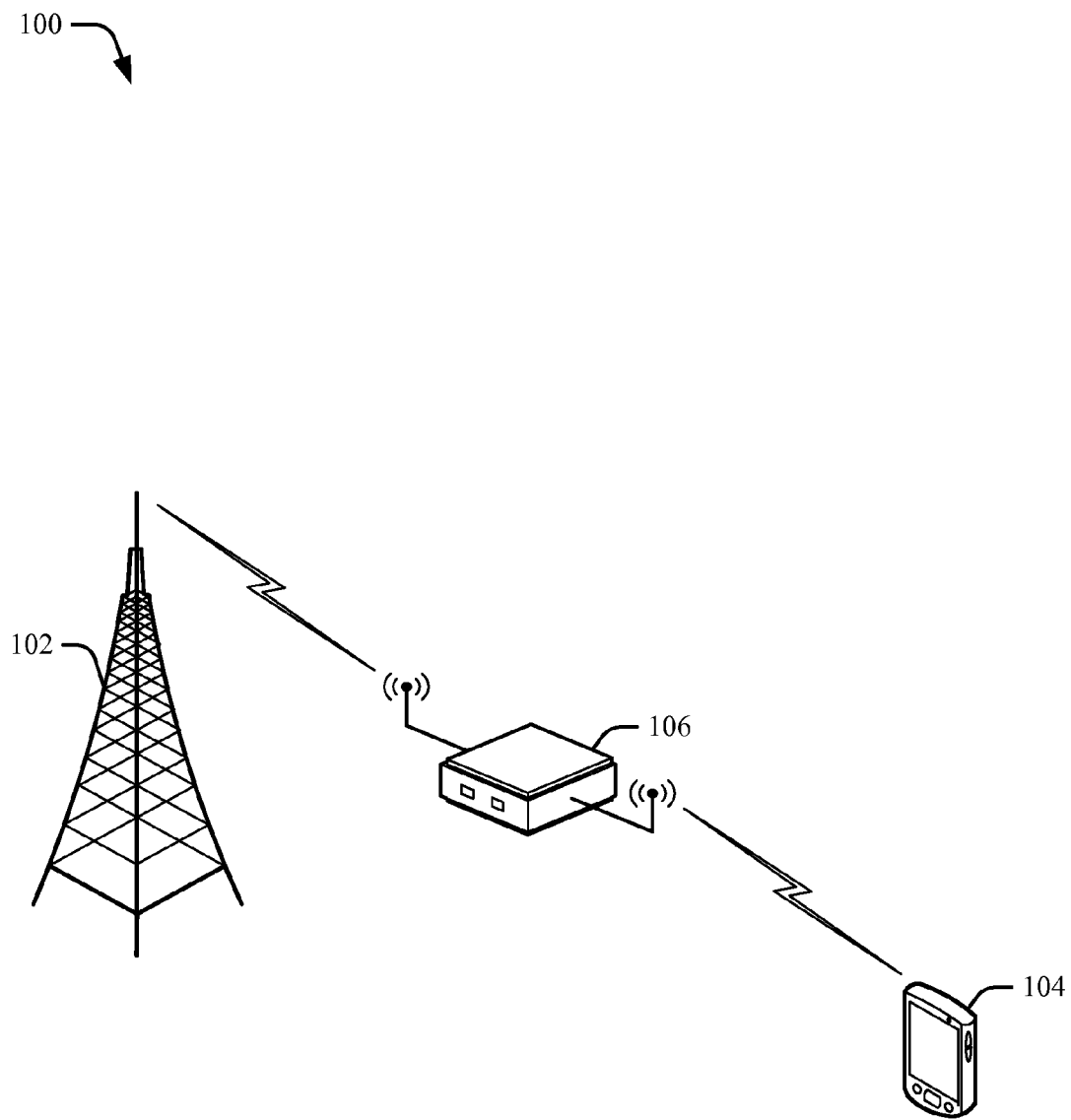
FIG. 1 illustrates an example operating environment in accordance with one or more embodiments.

FIG. 1 illustrates an example operating environment in accordance with one or more embodiments generally at 100. Operating environment 100 includes a base station 102, mobile station 104, and network extender 106 (extender 106). In the illustrated and described embodiments, base station 102, mobile station 104, and extender 106 can work in connection with any suitable wireless or cellular system. By way of example and not limitation, base station 102 can provide cellular service for Global System for Mobile Communications (GSM) and/or Code Division Multiple Access (CDMA) based technologies such as Evolution Data Optimized (EVDO), wideband CDMA (WCDMA) and/or High Speed Packet Access (HSPA), as well as others.

In at least some instances, base station 102 is a cellular base station that supports multiple generations of cellular technologies including fourth generation technologies such as 3G Long-Term Evolution (LTE) and/or Worldwide Interoperability for Microwave Access (WiMax). Alternately or additionally, in at least some instances, base station 102 can support legacy GSM and/or CDMA technologies.

Base station 102 can include multiple antennas to communicate over frequencies associated with different cellular technologies. In at least some instances, base station 102 includes an array of single and/or multiband antennas for dual band communication. In this particular example, base station 102 is configured to communicate over the Cellular (Cell) and Personal Communication System (PCS) frequency bands. Alternately or additionally, base station 102 can be configured to communicate over GSM and WCDMA frequency bands. It is to be appreciated and understood, however, that other cellular frequency bands can be utilized in connection with the principles described herein.

Mobile station 104 may comprise any suitable device such as by way of example and not limitation a cell phone, smart phone, wireless-enabled laptop, universal serial bus (USB) modem, express-card modem, broadband router, cellular endpoint, or wireless modem. Although referred to as mobile, mobile station 104 may be fixed or non-moving, such as a cellular modem device used for alarm, utility, automation, inventory control, or other remote services. Mobile station 104 may be configured to support a variety of wireless services including voice, voice over IP (VoIP), TCP/IP, wireless access protocol (WAP), short-media messages (SMS), and so on. In some cases, mobile station supports multiple cellular technologies and/or frequency bands for communication. In this particular example, mobile station 104 comprises a smart phone that is configured to communicate over the Cell and PCS frequency bands. It is to be appreciated and understood, however, that other cellular technologies and frequency bands can be utilized in connection with the principles described herein.

Base station 102 typically communicates with receivers, such as mobile station 104, over a communication link. In at least some instances, the receivers are mobile receivers that can move within a particular coverage area (e.g., cell or footprint) of base station 102. The communication link can comprise one or more uplink signals and one or more downlink signals. For example, in multiple-input multiple-output (MIMO) communication systems, the communication link may comprise multiple uplink or downlink signals across which data is spread for communication. In this particular example, reference of signal direction is made with respect to mobile station 104. Therefore, in this example, the uplink signal is transmitted from mobile station 104 to base station 102 and the downlink signal transmitted from base station 102 to mobile station 104.

Extender 106 is located proximate mobile station 104. In at least some embodiments, extender 106 can be connected to mobile station 104 either wirelessly or directly (not shown). Extender 106 can receive uplink signals and/or downlink signals over one or more frequency bands. In at least some embodiments, network extender 106 can amplify the received uplink signals and/or amplify the received downlink signals. Alternately or additionally, in at least some embodiments, network extender 106 can transmit amplified uplink signals and/or amplified downlink signals to a base station or mobile station, respectively. In at least some instances, extender 106 can extend the range of a mobile station by receiving, amplifying, and transmitting the amplified uplink and/or downlink signals.

Example Device

Figure 2:
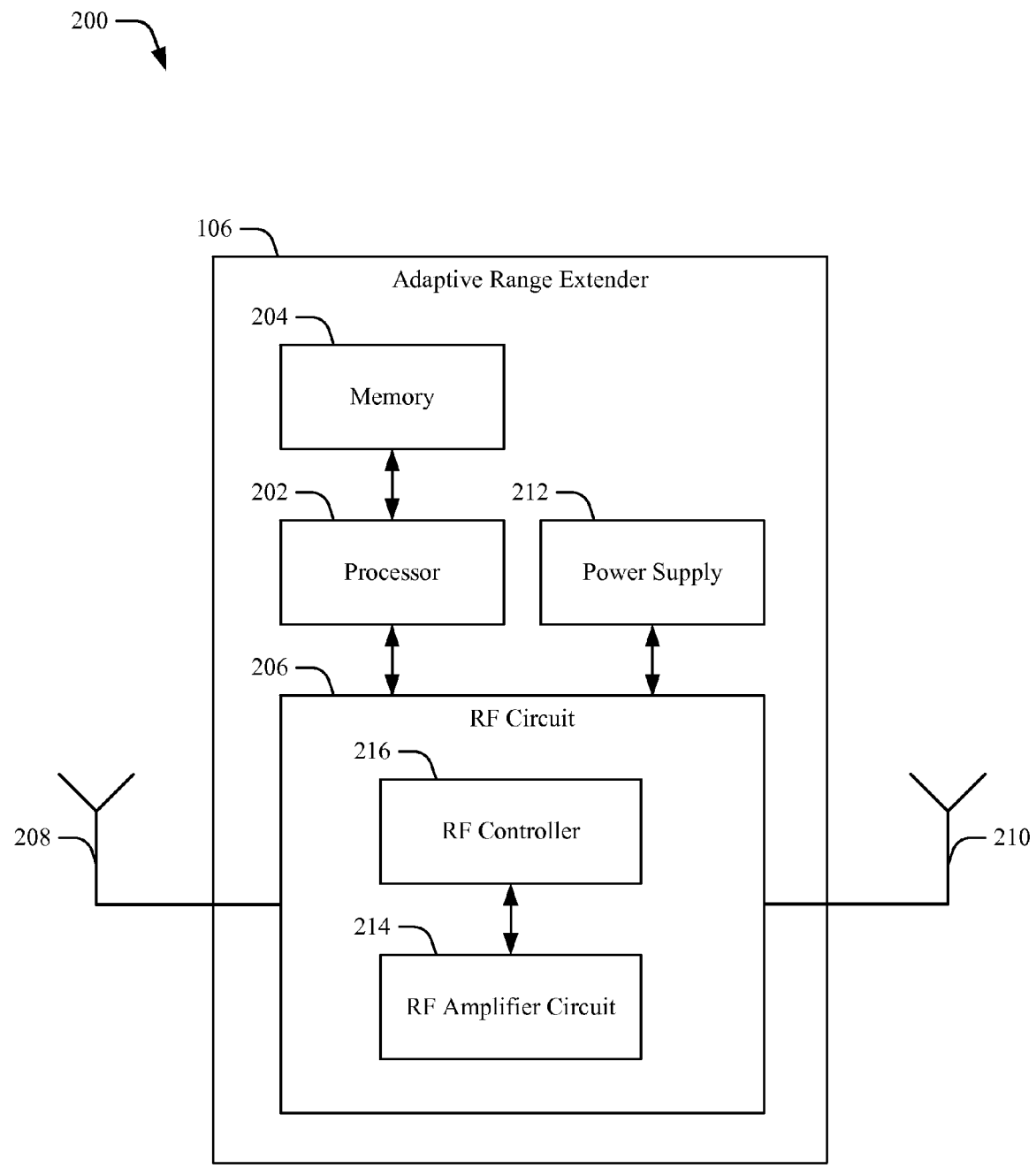
FIG. 2 illustrates an example device of FIG. 1 in accordance with one or more embodiments.

FIG. 2 illustrates network extender 106 in more detail in accordance with one or more embodiments. In this example, network extender 106 includes a processor 202 and memory 204. Processor 202 may be any suitable processor such as a microprocessor, embedded processor, or PIC processor, just to name a few. In at least some embodiments, processor 202 may include input/output (I/O) logic, analog-to-digital I/O, digital-to-analog I/O, or any combination thereof. This I/O functionality may be integrated with processor 202 or provided by support chips operably coupled with processor 202 (not shown).

Processor 202 is operably associated with memory 204, which may include any suitable type of memory such as RAM, ROM, EEPROM, NVRAM, low latency non-volatile memory such as flash, or other suitable computer-readable storage media. Alternatively or additionally, in at least some embodiments, processor 202 and memory 204 may be combined as a System-on-Chip (SoC), application specific integrated-circuit (ASIC), or field programmable gate array (FPGA). In such cases, processor 202 may also be connected with and access external memory of a different type, memory interface, or density.

Network extender 106 also includes RF circuit 206. In this particular example, RF circuit 206 is connected to antenna 208 and antenna 210. Antenna 208 and/or antenna 210 may be multiple band antennas for transmitting and/or receiving signals over different frequencies. Alternately or additionally, in at least some embodiments, RF circuit 206 may connect to external ports (not shown) suitable for connecting directly to a receiver or an external antenna via coax cabling. In such instances, an attenuator may be interposed between the port and the receiver to reduce power of signals transmitted to the receiver.

Network extender 106 further includes power supply 212 for powering various components such as processor 202 and RF circuit 206. Power supply 212 may comprise any suitable type of power supply such as switch-mode, linear, push-pull and so on. In at least some embodiments, power supply 212 may include multiple power supplies, such as a switch-mode power supply to condition input power and a linear power supply to power RF circuit 206. Power supply 212 may also provide an indication of fault status or a load level on power supply 212. For example, in this particular example, power supply 212 can indicate a load level associated with providing power to RF circuit 206. In at least some embodiments, a load level on power supply 212 may indicate an oscillation in RF circuit 206.

Power supply 212 may be configured to operate over a wide range of input voltages. For example, power supply 212 may be a switch-mode power supply capable of receiving power over a range of voltages associated with vehicles and/or industrial environments such as 8V to 36V DC. In other instances, when input power is supplied from an AC/DC adapter, power supply 212 may only accept power over a more-narrow voltage range such as 12V to 15V.

RF amplifier circuit 214 of RF Circuit 206 may amplify signals received over antenna 208 and/or antenna 210. In at least some embodiments, the amplified signals may be transmitted via antenna 208 and/or antenna 210. RF circuit 206 may also include RF controller 216. In some implementations, RF controller 216 adjusts signal amplification by RF amplifier circuit 214. Alternately or additionally, RF controller may direct cellular signal through circuits that bypass components RF amplifier circuit 214. RF controller 216 may be implemented as hardware, firmware, software, or any combination thereof. For example, Adaptive power controller may include processor-executable instructions stored on memory 204 which cause processor 202 to act accordingly when executed. RF controller 216 will be described in more detail in relation to processes discussed below. It is to be appreciated and understood, however, that other amplifier circuit configurations can be utilized in connection with the principles described herein.

Various parameters associated with RF amplifier circuit 214 can be selected to provide desired operating characteristics. For example, frequency bands, output power, gain, and maximum input power can be selected to provide desired operating characteristics. Table 1. illustrates some example parameters.

TABLE 1

| Band | Uplink | Downlink |
| --- | --- | --- |
| Operating Frequency | | |
| Band Class 0 | 824-849 MHz | 869-894 MHz |
| Band Class 1 | 1850-1910 MHz | 1930-1990 MHz |
| Maximum Output Power | | |
| Band Class 0 | 2 Watts/33 dBm | 0.1 mW/−10 dBm |
| Band Class 1 | 1 Watt/30 dBm | 0.1 mW/−10 dBm |
| Gain (Step Size: <=1 dB) | | |
| Band Class 0 | 0-40 dB | 40 dB |
| Band Class 1 | 0-40 dB | 40 dB |
| Maximum Input Power | | |
| Band Class 0 | 0 dBm | −20 dBm |
| Band Class 1 | 0 dBm | −20 dBm |

Figure 3:
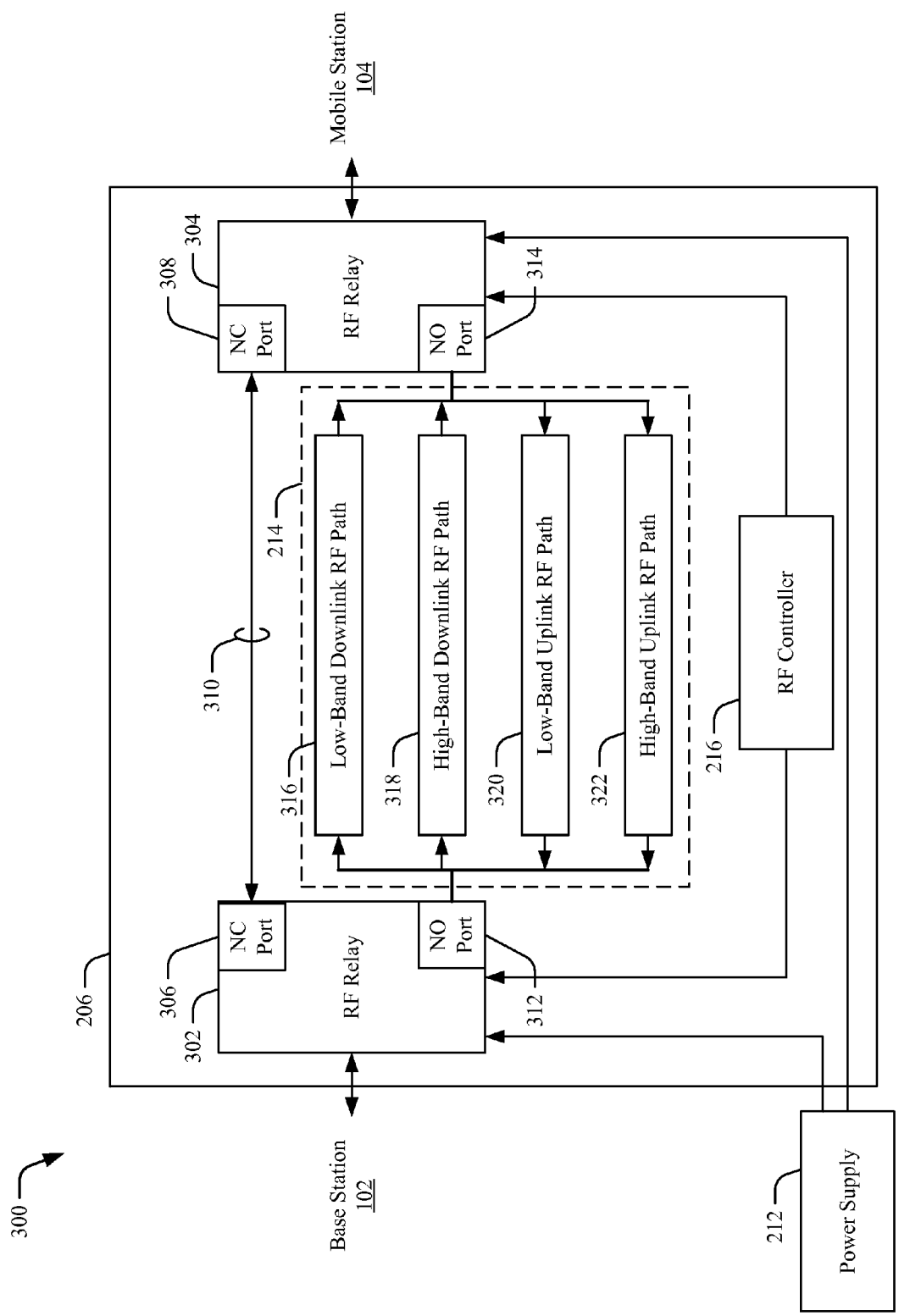
FIG. 3 illustrates an example hardware configuration for bypassing RF circuitry in accordance with one or more embodiments.

Next, consider FIG. 3 which illustrates an example hardware configuration of RF circuit 206 in accordance with one or more embodiments generally at 300. In this particular example, RF amplifier circuit 214 includes RF relays 302, 304 for directing RF signals (cellular signals) through different circuitry. A common port of RF relay 302 (not shown) is operably associated with base station 102 enabling RF circuit 206 to receive RF downlink signals from base station 102 or transmit RF uplink signals to base station 102. A common port of RF relay 304 (not shown) is operably associated with mobile station 104 enabling RF circuit 206 to receive RF uplink signals from mobile station 104 or transmit RF downlink signals to mobile station 104.

RF relay 302 includes normally closed port 306 (NC port 306), which can be connected to normally closed port 308 (NC port 308) of RF relay 304 via bypass circuit 310. Thus, when RF relays 302, 304 are not active or un-powered, communications between base station 102 and mobile station 104 pass through bypass circuit 310. In some embodiments RF relays 302, 304 permit RF signals to bypass (e.g., be directed or routed around) RF amplifier circuitry. This can be effective to permit continued communication of RF signals through network extender 106. Alternately or additionally, these bypassed RF signals may be passively amplified by the antennas connected to network extender 106. Bypass circuit 310 may be any suitable type of non-active circuitry, such as a matched impedance trace of 50 Ohms, 75 Ohms, or any suitable impedance. In some case, bypass circuit 310 may also include passive components, such as filters, ferrite beads, transient voltage suppression diodes, and so on.

RF relay 302 also includes normally open port 312 (NO port 312), which can be connected to normally open port 314 (NC port 314) of RF relay 304 via RF amplifier circuit 214. Thus, when RF relays 302, 304 active or energized, communications between base station 102 and mobile station 104 pass through RF amplifier circuit 214. RF amplifier circuit 214 may include one or more RF paths for amplifying a signal within a certain frequency range. As illustrated in FIG. 3, RF amplifier circuit 214 may include four RF paths 316-322 for amplifying uplink and downlink signals for dual band communication. In at least some embodiments, each RF path may be configured for a specific frequency range and/or gain. For instance, in this particular example, low-band downlink RF path 306 may be configured to amplify downlink signals from a base station, such as base station 102. In at least some embodiments, RF amplifier circuit 214 comprises four individual paths (e.g. two unidirectional paths for each frequency band).

RF relays 302, 304 may also be connected to power supply 212 or RF controller 216, either of which can control functionality of RF relays 302, 304. For example, when power supply 212 provides power to RF circuit 206, RF relays 302, 304, and other components of network extender 106, the power provided (or an indication thereof) may activate RF relays 302, 304 causing RF communication to be directed through RF amplifier circuit 214. Alternately or additionally, when power supply 212 does not, or is unable to, provide power to RF circuit 206, RF relays 302, 304, and other components of network extender 106, the lack of power (e.g., absence of voltage) may deactivate RF relays 302, 304 causing RF communication to be directed bypass circuit 310. This can be effective to permit continued communication of RF signals through network extender 106 when power supply 212 is unable to provide power (e.g., fault state). This may include periods of time associated with power failures, resets, faults, over-heating, brown-outs, and the like.

Alternately or additionally, RF controller 216 may cause RF communication to be directed through RF amplifier circuit 214 under normal operating conditions, such as when RF amplifier circuit 214 is functioning normally. In some embodiments, RF controller 216 may cause RF communication to be directed through bypass circuit 310 in response to determining that network conditions do not necessitate amplification of the RF communication (e.g., proximate a cell tower) Bypassing RF amplifier circuit 126 can reduce a noise factor applied or injected into an RF environment of the network. By so doing, effects of the network extender 106 on the network may be minimized when non-amplified signal strength is sufficient for communication.

RF controller 216 may also cause RF communication to be directed through bypass circuit 310 when RF amplifier circuit 214 is not functioning normally, such as when an oscillation develops in one or more of the amplifier circuits. For example, RF controller 216 may direct RF communication through bypass circuit 310 responsive to detecting an oscillation and then redirect the RF communication through RF amplifier circuit 214 once the oscillation is resolved. This can be effective to permit communication between base station 102 and mobile station 104 to continue while the oscillation is resolved.

Figure 4:
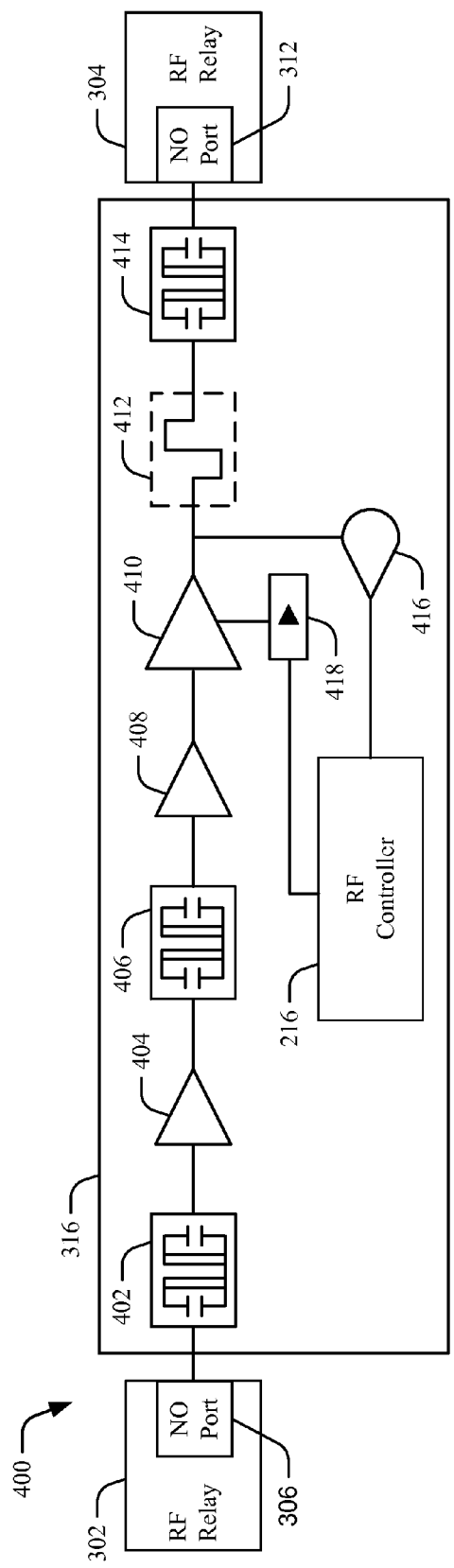
FIG. 4 illustrates some example components of the hardware configuration of FIG. 3 in accordance with one or more embodiments.

FIG. 4 illustrates some example components of low-band downlink RF path 316 (RF path 316) of FIG. 3 in accordance with one or more embodiments generally at 400. RF path 316 can include a variety of filters, amplifiers, or attenuators to condition and/or increase a magnitude of the downlink signal received from RF relay 302. For instance, in this particular example, RF path 316 includes filter 402, amplifier 404, filter 406, amplifier 408, variable attenuator 410, filter 412, and filter 414. Any suitable filter may be used including band-pass filters, pi filters, saw filters, and so on. Alternately or additionally, in at least some cases, amplifier 404 and amplifier 408 may be low-noise amplifiers (LNAs).

Variable attenuator 410 can provide a range of amplification to the downlink signal. In at least some instances, a gain of variable attenuator 410 can be set by RF controller 216. For example, in some embodiments, RF controller 216 may utilize an analog output of a microcontroller to set or adjust the gain of variable attenuator 410. In at least some embodiments, the output of the microcontroller may be digital outputs and/ or digital output operably coupled with a digital-to-analog converter. Alternately or additionally, RF path 316 may include a variable gain amplifier to provide a range of amplification to the downlink signal. The variable gain amplifier may be implemented or controlled in ways similar to variable attenuator 410.

In at least some embodiments, RF path 316 can amplify a downlink signal by as much as 30 dB to 40 dB. In at least some embodiments, power meter 416 provides an indication of magnitude of the amplified downlink signal to RF controller 216. In this particular example, RF controller 216 is operably coupled to variable attenuator 410 and can adjust amplification of the downlink signal of RF link 306. In this particular example, an output of RF controller 216 can control digital-to-analog converter 418 (DAC 418, e.g., digital resistor) to adjust variable attenuator 410 and thus the amplification of the downlink signal of RF link 306.

In at least some embodiments, RF controller 216 can measure an RF power level of an amplified signal utilizing the output of power meter 416. For example, RF controller 216 may utilize an analog input of a microcontroller to measure the RF power level on the amplified signal. Alternately or additionally, in at least some embodiments, the input of the microcontroller may be digital and/or operable coupled with an analog-to-digital converter.

Although not shown for visual brevity, high-band downlink RF path 318 (RF path 318) of FIG. 3 can be configured or implemented in ways similar to low-band downlink RF path 316. In such implementations, high frequency filters and components may be used for amplification of a higher frequency downlink signal.

Figure 5:
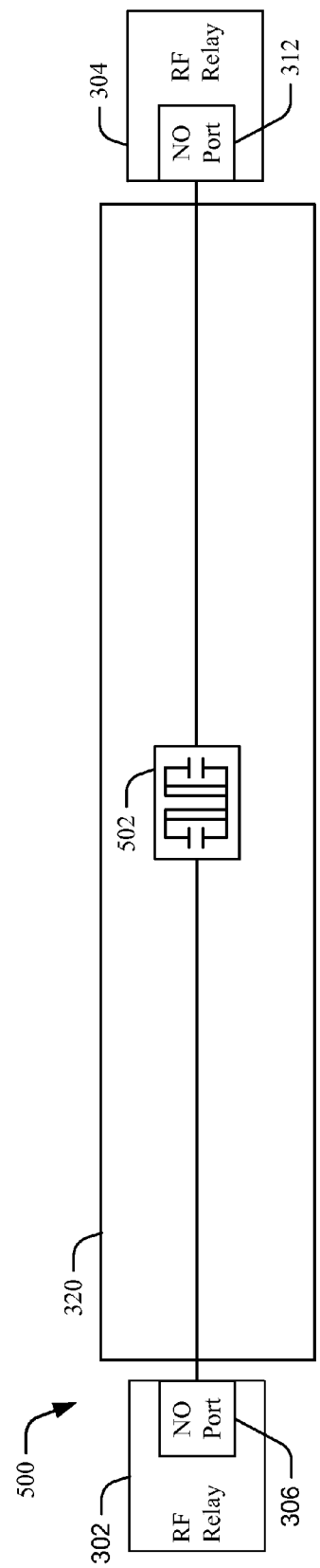
FIG. 5 illustrates some other example components of the hardware configuration of FIG. 3 in accordance with one or more embodiments.

FIG. 5 illustrates some example components of low-band uplink RF path 320 (RF path 320) of FIG. 3 in accordance with one or more embodiments generally at 500. RF path 320 can include a variety of filters, attenuators, and amplifiers to condition and/or increase a magnitude of the uplink signal received from relay 304, such as those shown with reference to RF path 316. In this particular example, RF path 320 includes filter 502, which may comprise any suitable type of filter such as a band-pass filter, pi filter, saw filter, and so on. In some embodiments, RF path 320 may provide amplification and may include some or all of the components described with reference to RF path 316.

Although not shown for visual brevity, high-band uplink RF path 322 (RF path 322) of FIG. 3 can be configured or implemented in ways similar to low-band uplink RF path 320. In such implementations, high frequency filters and components may be used for filtering or amplification of a higher frequency uplink signal.

Alternately or additionally, RF circuit 206 may include multiplexers that can separate a signal from a common feed into one or more signals of different frequencies. In at least some embodiments, the signals of different frequencies are uplink and downlink signals of a communication link. In at least some embodiments, multiplexers can combine signals having different frequencies to a common feed. For example, multiplexers may separate Cell band and PCS band signals into their respective uplink and downlink signals. In at least some embodiments, a multiplexer may be operably coupled with the normally open ports of one or both RF relays to separate signals entering, or combine signals leaving, RF amplifier circuit 214.

Example Methods

The following discussion describes techniques of passive bypass for network extending. These processes are shown as sets of acts that specify operations performed, such as through one or more entities or components, and are not necessarily limited to the order shown for performing the operations by the respective blocks. In portions of the following discussion reference may be made to environment 100 of FIG. 1 as well as entities of environment 100 illustrated in FIG. 2, 3, 4, or 5.

Figure 6:
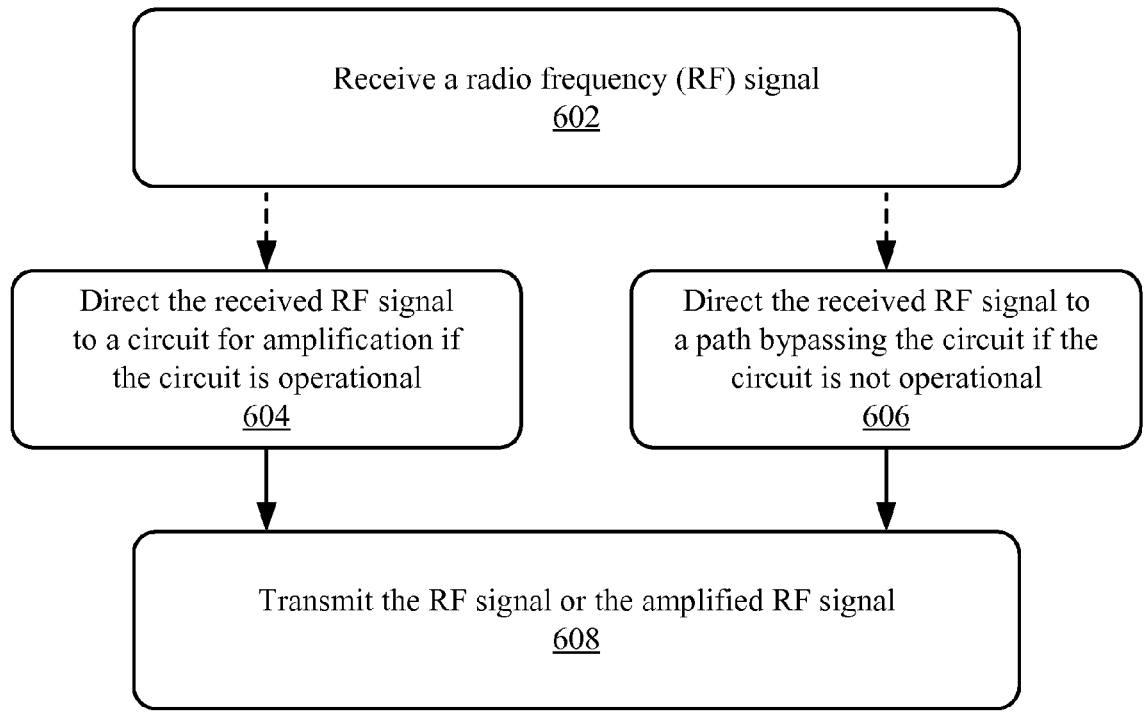
FIG. 6 is a flow diagram that illustrates steps in a method in accordance with one or more embodiments.

FIG. 6 is a flow diagram that describes steps in a method in accordance with one or more embodiments. The method can be implemented in connection with any suitable hardware, software, firmware, or combination thereof. The method can be implemented in connection with any systems such as those described above.

Step 602 receives a RF signal. In at least some embodiments the RF signal is a cellular downlink or uplink signal. The RF signal may be received from an antenna or direct connection port that is coupled with RF circuitry. In at least some embodiments, the received RF signal is separated (e.g., filtered) by frequency and/or directionality onto two or more RF paths. As an example, consider FIG. 1 which illustrates an example operating environment. In this example, adaptive range extender 106 can receive cellular uplink signals from mobile station 104 and/or cellular downlink signals from base station 102. In at least some embodiments, the received cellular signal is filtered by frequency and/or directionality onto two or more RF paths.

From step 602, the method may proceed to step 604 or step 606. Step 604 directs the received RF signal to a circuit for amplification (e.g., RF amplifier circuit 214) if the circuit is operational. Step 604 may include determining an operational state of the amplifier circuit, such as whether the circuit is functional or in a fault state. For example, RF controller 216 may determine that RF amplifier circuit 214 is operating normally (e.g., not oscillating) or properly powered by power supply 212.

Step 604 may direct the RF signal to the amplifier circuit via a relay operably coupled with the circuit and a path bypassing the circuit. In such cases, a common port of the relay may be connected to an RF port at which the RF signal is received, a normally open port of the relay may be connected to the amplification circuit, and a normally closed port of the relay may be connected to the path bypassing the amplification circuit. In at least some embodiments, the relay can be caused to direct the RF signal to the amplifier circuit by applying voltage from the power supply to a control pin of the relay. This can be effective to direct the RF signal to the amplification circuit when power is provided to the amplification circuit. In some embodiments, RF controller 216 may control or over-ride the control signal of the relay.

Step 606 directs the received RF signal to a path bypassing the amplifier circuit if the amplifier circuit is not operational. This may be effective to permit the RF signal to be passively transmitted even though the amplifier circuit is not operational. Alternately, bypassing the amplifier circuit may be effective to permit the RF signal to be passively transmitted when the amplifier circuit is operational. In some embodiments, the RF signal can be passively amplified by an antenna associated with the path bypassing the amplifier circuit.

Step 606 may include determining an operational state of the amplifier circuit, such as whether the circuit is not operational or in a fault state. For example, RF controller 216 may determine that RF amplifier circuit 214 is not operating normally (e.g., not oscillating) or not properly powered by power supply 212. Alternately or additionally, step 606 may include determining current conditions of an RF environment in which network extender 106 operates. For example, RF controller 216 may determine that amplification of the RF signal is not necessary due to proximity with a base station. Thus, when close to a base station or when non-amplified signal strength is sufficient for communication, RF controller 216 may direct the RF signal through a path bypassing amplifier circuit 214.

Step 606 may direct the RF signal to the path bypassing the amplifier circuit via a relay operably coupled with the circuit and the path bypassing the circuit. In such cases, a common port of the relay may be connected to an RF port at which the RF signal is received, a normally open port of the relay may be connected to the amplification circuit, and a normally closed port of the relay may be connected to the path bypassing the amplification circuit.

In at least some embodiments, the relay can be caused to direct the RF signal to the path bypassing the amplifier circuit by removing a voltage applied to a control pin of the relay. For example, a control voltage provided by a power supply would decrease when the power supply failed, causing the normally closed port of the relay to connect to the common port. This can be effective to direct the RF signal to the path bypassing the amplification circuit when the power supply fails to provide power for the amplifier circuit. In some embodiments, RF controller 216 may control or over-ride the control signal of the relay, such as when bypassing the amplifier circuitry when the amplifier circuitry is operational, yet network conditions indicate that amplification of the cellular signal is not necessary (e.g., near a cell tower).

Step 608 transmits the RF signal or the amplified RF signal. The RF signal may be received from the path bypassing the circuit. The amplified RF signal may be received from the circuit which amplifies the RF signal. The RF signal or the amplified RF signal may be transmitted via another antenna to a mobile station or base station. This permits continued transmission of the RF signal if the circuit which amplifies the RF signal becomes non-functional (e.g. power fault or oscillation).

Figure 7:
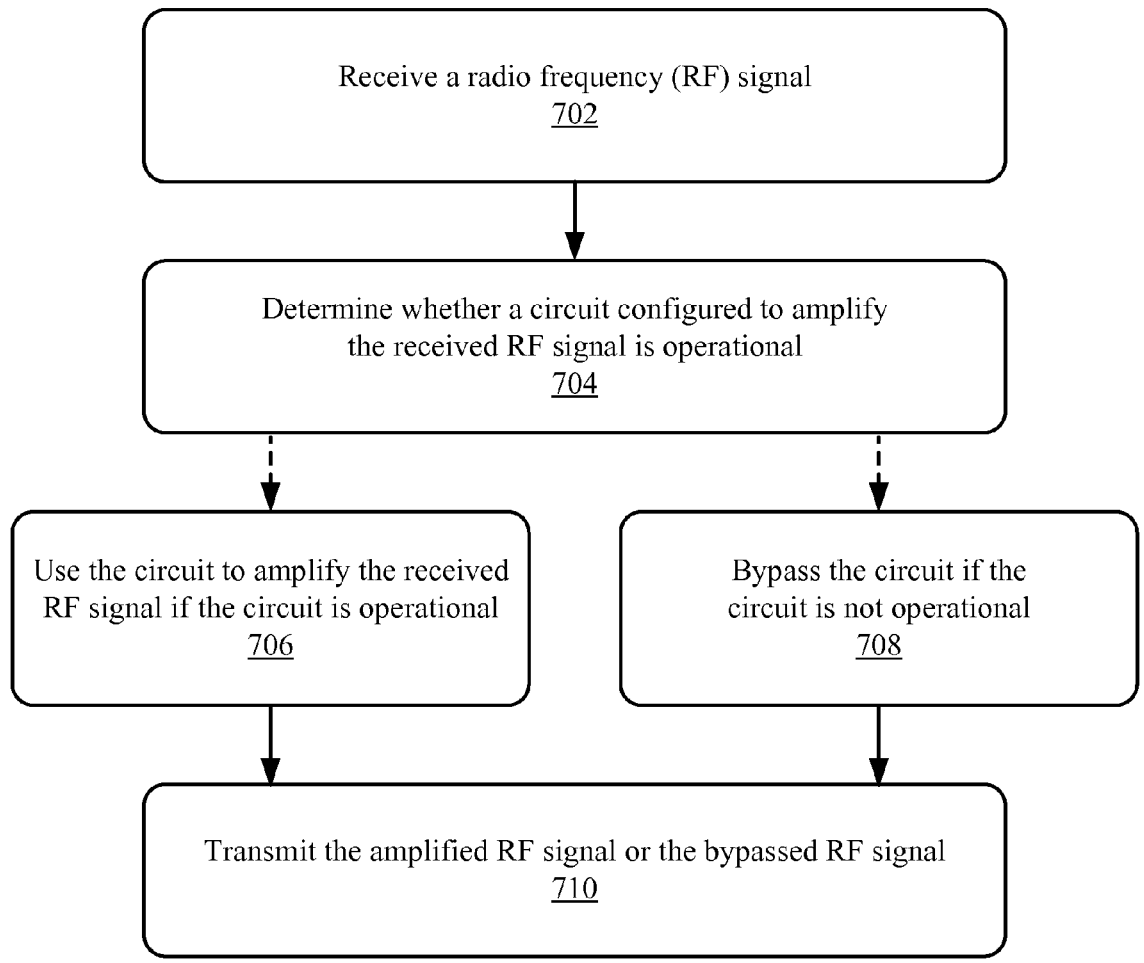
FIG. 7 is a flow diagram that illustrates steps in a method in accordance with one or more embodiments.

Now consider FIG. 7, which is a flow diagram that describes steps in a method in accordance with one or more embodiments. The method can be implemented in connection with any suitable hardware, software, firmware, or combination thereof. The method can be implemented in connection with any systems such as those described above.

Step 702 receives a RF signal. In at least some embodiments the RF signal is a cellular downlink signal received from a cellular base station or a cellular uplink signal received from a mobile station. In at least some embodiments, the received RF signal is filtered by frequency and/or directionality onto two or more RF paths.

Step 704 determines whether a circuit configured to amplify the received RF signal is operational. This may include determining whether the circuit is in a state of normal operation, power failure, oscillation, over-current, fault recovery, or permanent failure. In at least some embodiments, the determination is based on a state of a power supply associated with the amplifier circuit. In some cases, the determining may be performed by a hardware component or circuit, such as an RF relay. Alternately or additionally, a fault code may be indicated by changing a state of one or more light-emitting diodes associated with the amplifier circuit. In some embodiments, step 704 may determine conditions of an RF environment in which a network extender operates to determine if amplification of the RF signal is necessary.

Step 706 uses the amplifier circuit to amplify the RF signal if the circuit is operational. This may be effective to provide an amplified RF signal. The amplified RF signal may be useful to extend a range of a cellular network. The signal may be dynamically or incrementally amplified to prevent oscillation of the amplifier circuit. For example, RF controller 216 may monitor a power level of an amplified signal and reduce an amount of gain by which the signal is amplified when the power level of the amplified signal exceeds a threshold.

Step 708 bypasses the circuit if the circuit is not operational. Bypassing the circuit may bypass active amplifier circuitry that is not operational. An RF signal may not be able to pass through this non-operational active amplifier circuitry. Bypassing the active amplifier circuitry may enable the RF signal to be transmitted using other paths, such as passive paths and/or circuitry. This can permit a network extender to passively amplify an RF signal, even when active amplifier circuitry is non-functional. Alternately or additionally, the circuit may be bypassed when network interference or feedback oscillation is detected. In some embodiments, the circuit is bypassed when conditions of the RF environment indicate that amplification of the RF signal is not necessitated, such as when near a cell tower or when signal strength is sufficiently strong to enable communication of non-amplified RF signals.

Step 710 transmits the RF signal or the amplified RF signal. The RF signal may be received from the path bypassing the circuit. The amplified RF signal may be received from the circuit which amplifies the RF signal. The RF signal or the amplified RF signal may be transmitted via another antenna to a mobile station or base station. This permits continued transmission of the RF signal if the circuit which amplifies the RF signal becomes non-functional (e.g. power fault or oscillation).

Figure 8:
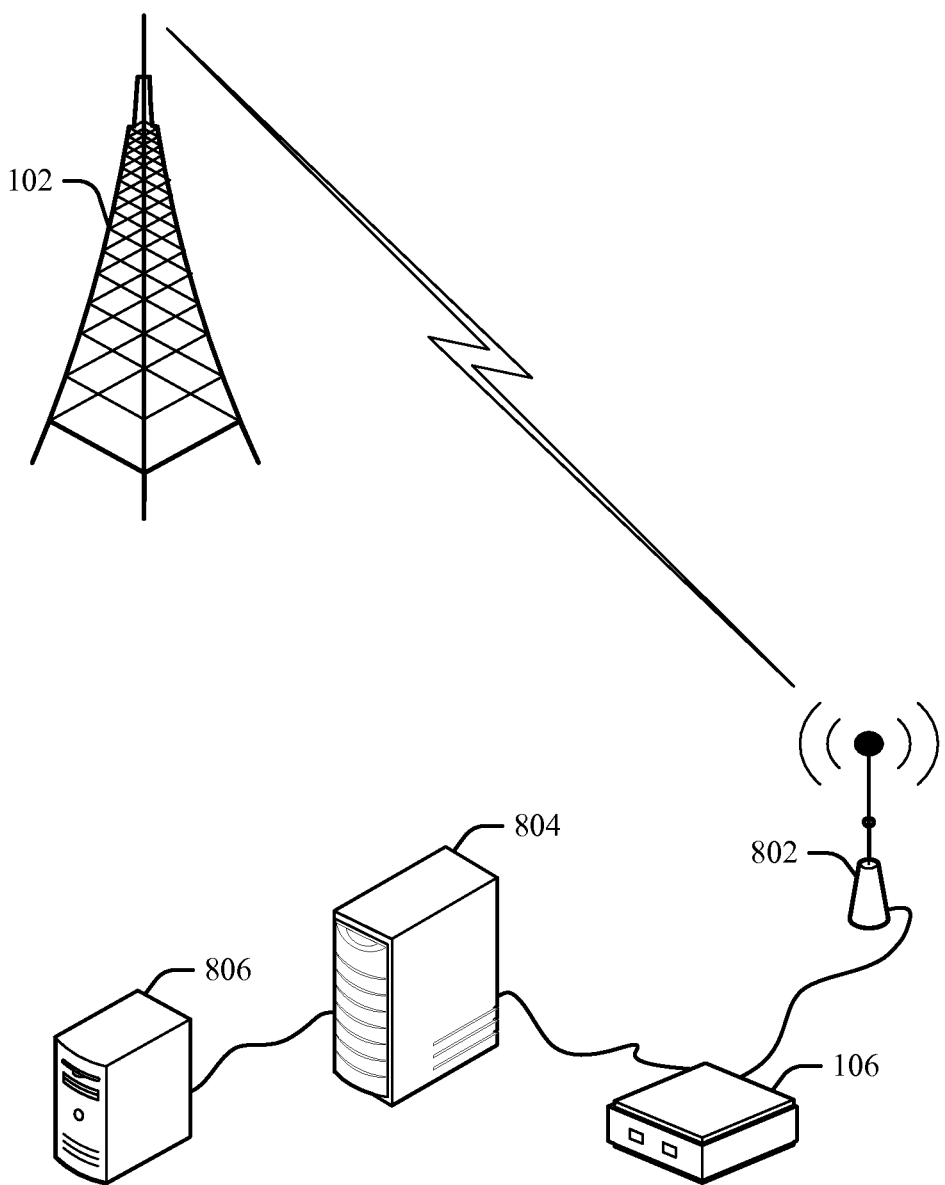
FIG. 8 illustrates an example implementation of a network extender in accordance with one or more embodiments.

FIG. 8 illustrates an example implementation of a network extender in accordance with one or more embodiments. In this particular example, network extender 106 is configured as part of a fire and/or security communication system. A first port of network extender 106 may be operably associated with network antenna 802 configured for communication over a cellular network provided by base station 102. A second port of the network extender may be operably associated with control panel 804, which may be configured as a fire/security panel or automated alarm system. Control panel 804 may include a wireless modem (similar to a wireless interface of mobile station 104) with which a second port of network extender 106 is connected (e.g., a direct connection).

Alternately or additionally, control panel 804 can be connected to battery-powered uninterruptable power supply 806 (UPS 806) that provides power when a primary power source of control panel 840 fails. In the context of the present example, the control panel 804 and network extender 106 continue to function when a primary power source fails (e.g. loss of AC power). Here, techniques of passive bypass permit continued passive communication through network extender 106 when the primary power source is not available. This example is but one of numerous scenarios in which a network extender with passive bypass can be implemented. It should be noted that apparatuses and/or techniques described herein may be implemented in any environment, application, or industry without departing from the spirit of the concepts presented herein.

CONCLUSION

In one or more embodiments, a cellular signal is received and directed to a path bypassing active amplifier circuitry. This may be in response to the active amplifier circuitry being non-operational (e.g., in a fault state) or in an RF environment not necessitating amplification. Bypassing the active amplifier circuitry may enable transmission of the cellular signal.

In other embodiments, it is determined whether RF amplification circuitry is operational and RF signals are directed based on the determination. The RF signals are directed to an input port of the RF amplification circuitry if the RF amplification circuitry is operational or directed to other circuitry to bypass the RF amplification circuitry if the RF amplification circuitry is not operational.

Although subject matter has been described in language specific to structural features and/or methodological acts, it is to be appreciated and understood that the subject matter defined in the appended claims is not necessarily limited to the specific features or acts described above. Rather, the specific features and acts described above are disclosed as example forms of implementing the claims.

What is claimed is:

1. A method comprising:
receiving, at an input port, radio frequency (RF) signals;
receiving, from a power supply associated with first circuitry configured to amplify the RF signals, an indication of the power supply's load level, the first circuitry including at least two low-noise amplifiers to amplify the RF signals and a variable attenuator to adjust an amount of gain by which the first circuitry amplifies the RF signals;
determining, based on the indication of the power supply's load level, that the first circuitry is in a state of oscillation;
directing, via two RF relays of second circuitry configured to bypass the first circuitry and in response to the first circuitry being in a state of oscillation, the RF signals received at the input port through an RF bypass circuit effective to bypass the first circuitry and enable transmission of the RF signals via an output port;
adjusting, based on a predefined amplification threshold, an amount of gain by which the first circuitry amplifies the RF signals to resolve the first circuitry's state of oscillation;
receiving, from the power supply, another indication of the power supply's load level;
determining, based on the other indication of the load level, that the first circuitry is no longer in the state of oscillation;
directing, via the two RF relays of the second circuitry and in response the first circuitry no longer being in the state of oscillation, the RF signals received at the input port to the first circuitry effective to resume amplification of the RF signals to provide the amplified RF signals; and
transmitting the amplified RF signals via the output port.

2. The method as recited in claim 1, wherein the RF signals are received via a first antenna coupled with the input port and transmitted via a second antenna coupled with the output port.

3. The method as recited in claim 1, wherein the adjusting of the amount of gain is performed via an analog output or digital output coupled with the variable attenuator of the first circuitry.

4. The method as recited in claim 3, wherein the RF relays are controlled at least in part by the power supply associated with the first circuitry.

5. The method as recited in claim 1, wherein a common port of a first of the two relays is operably coupled with an antenna, a normally-closed port of the first relay is connected to the RF bypass circuit bypassing the first circuitry, and a normally-open port of the first relay is connected to the first circuitry.

6. The method as recited in claim 1, wherein the RF signals are cellular downlink signals transmitted from a base station.

7. The method of claim 1, further comprising receiving, from an RF power meter associated with the first circuitry, an indication of a power level of the amplified RF signals and adjusting the amount of gain by which the RF signals are amplified based on the indication received from the RF power meter.

8. A system comprising:
an input port configured to receive radio frequency (RF) signals;
first circuitry configured to amplify the RF signals to provide amplified RF signals, the first circuitry including at least two low-noise amplifiers to amplify the RF signals and a variable attenuator to adjust an amount of gain by which the first circuitry amplifies the RF signals;
second circuitry configured to enable the RF signals to bypass the first circuitry, the second circuitry including two RF relays to direct the RF signals through the first circuitry or to an RF bypass circuit that bypasses the first circuitry;
a power supply configured to power the first circuitry and provide an indication of a load level on the power supply;
an output port configured to transmit the RF signals or the amplified RF signals;
one or more processors;
a memory device embodying processor-executable instructions that, responsive to execution by the processor; implement an RF controller configured to:
receive, from the power supply, the indication of the power supply's load level;
determine, based on the indication of the load level, that the first circuitry is in a state of oscillation;
direct, via the two RF relays and in response to the first circuitry being in a state of oscillation, the RF signals received at the input port to the RF bypass circuit effective to bypass the first circuitry;
adjust, based on a predefined amplification threshold, the amount of gain by which the first circuitry amplifies the RF signals to resolve the first circuitry's state of oscillation;
receive, from the power supply, another indication of the power supply's load level;
determine, based on the other indication of the load level, that the first circuitry is no longer in the state of oscillation; and
direct, via the two RF relays and in response the first circuitry no longer being in the state of oscillation, the RF signals received at the input port to the first circuitry effective to resume amplification of the RF signals to provide the amplified RF signals.

9. The system of claim 8, wherein the input port is operably coupled with a first antenna and the output port is operably coupled with a second antenna.

10. The system of claim 8, wherein the RF controller is further configured to direct the RF signals received at the input port to the RF bypass circuit in response to detecting feedback or interference in the first circuitry.

11. The system of claim 8, wherein a first one of the two RF relays is connected to the input port and a second one of the two RF relays is connected to the output port.

12. The system of claim 11, wherein normally-closed terminals of the first RF relay and the second RF relay are connected to the RF bypass circuit.

13. The system of claim 11, wherein normally-open terminals of the first RF relay and the second RF relay are connected to the first circuitry that is configured to amplify the RF signals.

14. The system of claim 8, wherein the one or more processors and the memory device are implemented at least in part as a microcontroller and the RF controller is further configured to set or adjust a gain of the first circuitry through an analog output or digital output of the microcontroller that is operably coupled with the variable attenuator.

15. The system of claim 14, wherein the first circuitry further comprises an RF power meter configured to indicate a power level of the amplified RF signals and the RF controller is further configured to measure the power level of the amplified RF signals through an analog input or digital input of the microcontroller that is operably coupled with the RF power meter.

16. One or more computer-readable memory devices embodying processor-executable instructions that, responsive to execution by one or more processor, perform operations comprising:
   receiving, from a power supply associated with first circuitry configured to amplify RF signals received at an input port, an indication of the power supply's load level, the first circuitry including at least two low-noise amplifiers to amplify the RF signals and a variable attenuator to adjust an amount of gain by which the first circuitry amplifies the RF signals;
   determining, based on the indication of the power supply's load level, that the first circuitry is in a state of oscillation;
   directing, via two RF relays of second circuitry configured to bypass the first circuitry and in response to the first circuitry being in a state of oscillation, the RF signals through an RF bypass circuit effective to bypass the first circuitry and enable transmission of the RF signals via an output port;
   adjusting, based on a predefined amplification threshold and using the variable attenuator, an amount of gain by which the first circuitry amplifies the RF signals to resolve the first circuitry's state of oscillation;
   receiving, from the power supply, another indication of the power supply's load level;
   determining, based on the other indication of the load level, that the first circuitry is no longer in the state of oscillation; and
   directing, via the two RF relays of the second circuitry and in response the first circuitry no longer being in the state of oscillation, the RF signals received at the input port to the first circuitry effective to amplify the RF signals to provide the amplified RF signals and enable transmission of the amplified RF signals via the output port.

17. The one or more computer-readable memory devices of claim 16, wherein the operations further comprise receiving, from an RF power meter associated with the first circuitry, an indication of a power level of the amplified RF signals and wherein adjusting the amount of gain is performed based on the indication of the amplified RF signal's power level.

18. The one or more computer-readable memory devices of claim 16, wherein a first one of the two RF relays is connected to the input port and a second one of the two RF relays is connected to the output port.

19. The one or more computer-readable memory devices of claim 16, wherein:
   normally-closed terminals of the first RF relay and the second RF relay are connected to the RF bypass circuit; and
   normally-open terminals of the first RF relay and the second RF relay are connected to the first circuitry that is configured to amplify the RF signals.

20. The one or more computer-readable memory devices of claim 16, wherein the RF signals are received via a first antenna coupled with the input port and transmitted via a second antenna coupled with the output port.

* * * * *